United States Patent
Juengling

(10) Patent No.: US 8,629,483 B2
(45) Date of Patent: Jan. 14, 2014

(54) LOCALLY 2 SIDED CHC DRAM ACCESS TRANSISTOR STRUCTURE

(75) Inventor: Werner Juengling, Boise, ID (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 270 days.

(21) Appl. No.: 13/047,774

(22) Filed: Mar. 14, 2011

(65) Prior Publication Data

US 2012/0235214 A1    Sep. 20, 2012

(51) Int. Cl.
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |

(52) U.S. Cl.
USPC .................................. 257/288; 257/E29.255

(58) Field of Classification Search
USPC ........................................... 257/288, E29.255
See application file for complete search history.

(56) References Cited

U.S. PATENT DOCUMENTS 7,161,206 B2 * 1/2007 Oh et al. ....................... 257/316
7,902,584 B2 * 3/2011 Nakajima ..................... 257/308

* cited by examiner

*Primary Examiner* — Howard Weiss
(74) *Attorney, Agent, or Firm* — Winston Hsu; Scott Margo

(57) ABSTRACT

A method for forming a DRAM memory with a two-sided transistor includes: providing a silicon finFET structure having at least two fins, and a trench between the fins; forming high ohmic gates on either side of the fins; forming a hole between each pair of high ohmic gates to enable connection between the pair of high ohmic gates; forming a gate on one side of the trench and underneath one of the pair of high ohmic gate; forming a layer of oxide over the gate; and depositing tungsten in the trench to form a thick layer of metal at the bottom to form a word line.

6 Claims, 1 Drawing Sheet

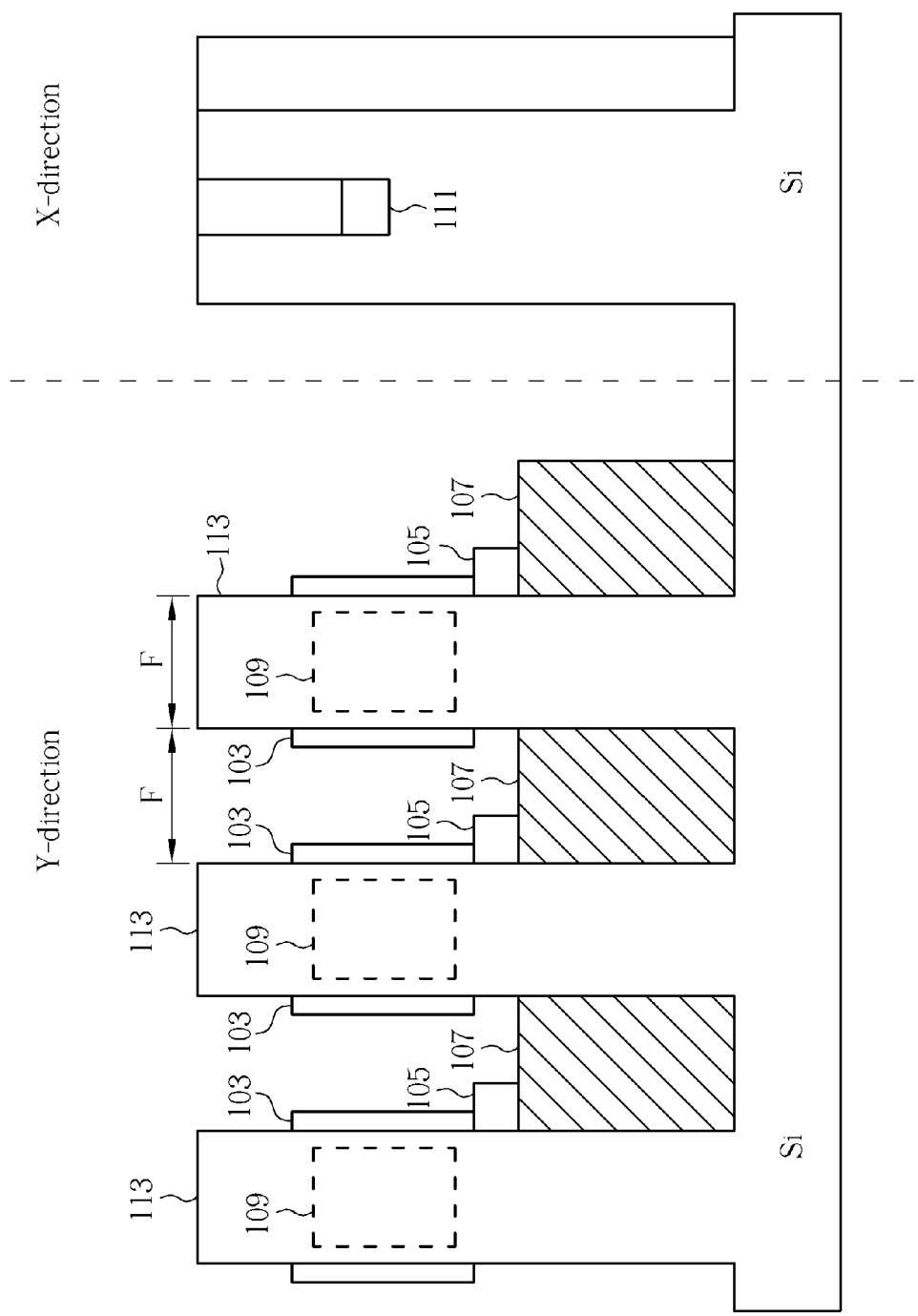

LOCALLY 2 SIDED CHC DRAM ACCESS TRANSISTOR STRUCTURE

BACKGROUND OF THE INVENTION

1. Field of the Invention

This invention relates to DRAM memories, and more particularly, to a DRAM memory cell with a novel access transistor structure.

2. Description of the Prior Art

In the field of semiconductors, the modern trend is towards miniaturization, resulting in high density DRAM cells. This allows a greater number of word lines and digit lines to occupy a smaller area, allowing greater speed of computation.

As semiconductor devices become miniaturized, however, individual DRAM memory cells become closer together. This often results in a strong word line-word line coupling which is less than desirable. Therefore it is an objective of the present invention to create a DRAM cell structure that can avoid this problem.

SUMMARY OF THE INVENTION

With this in mind, the present invention aims to provide a DRAM structure that can avoid strong word line-word line coupling, by providing left and right sided gates that can couple together, thereby providing local connections to the word line, and enabling low ohmic word lines in a silicon wafer.

A method for forming a DRAM memory with a two-sided transistor comprises: providing a silicon finFET structure having at least two fins, and a trench between the fins; forming high ohmic gates on either side of the fins; forming a hole between each pair of high ohmic gates to enable connection between the pair of high ohmic gates; forming a gate on one side of the trench and underneath one of the pair of high ohmic gate; forming a layer of oxide over the gate; and depositing tungsten in the trench to form a thick layer of metal at the bottom to form a word line.

A finFET structure comprises: at least two fins having a trench between the fins; a pair of high ohmic gates formed on either side of each fin; a hole formed within each fin for electrically connecting each pair of high ohmic gates; a gate formed on one side of the trench and below one of the pair of high ohmic gates; and a low ohmic word line formed underneath the gate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The FIGURE is a cross-section of a DRAM memory showing both the x-direction and the y-direction.

DETAILED DESCRIPTION

Typical word lines are high ohmic which makes the cross-coupling more likely. To solve this problem, the present invention creates buried low ohmic word lines, and couples left and right sided gates on either side of a fin to thereby create a two-sided transistor. The advantage of this type of structure is that it can turn on faster and move more current than prior art one-sided gates.

A conventional finFET structure comprises a plurality of silicon fins each having a gate formed on either side, where the gates operate independently from each other. This necessitates very narrow, high ohmic word lines thereby resulting in strong word line-word line coupling. To avoid this, the present invention aims to create low ohmic word lines that operate in conjunction with a two-sided transistor.

Please refer to the FIGURE. The FIGURE is a diagram of a DRAM memory layout according to an exemplary embodiment of the present invention. As shown in the FIGURE, the left-hand side shows a cross-section of the DRAM memory layout in the y-direction, and the right-hand side shows a cross-section of the DRAM memory layout in the x-direction, for reference. The x-direction cross-section is a standard DRAM crosshair cell; the only difference being that there is a hole which is formed in the bottom of the trench. This hole enables the coupling of gates across the finFET structure.

The y-direction cross-section shows a finFET structure. As shown in the diagram, the silicon pillars have gates on either side. Typically, these gates would run independently from each other. As detailed in the above paragraph, holes are formed in the trench. These are indicated by the dashed square box within the silicon pillars. These holes allow connection across the pillars, thereby coupling the right and left gates together.

At the bottom of the trench, a plurality of word lines is formed. Compared to the prior art, these word lines are formed from thick layers of metal, which renders them low ohmic and therefore reduces the possibility of word line-word line coupling.

In order to prevent power from having to be provided at the end of each word line, the structure shown in the FIGURE enables local connection. This is provided by the gate shown on one side of the trench. Due to the electrical coupling between the gates formed on either side of the silicon pillars, coupling is also enabled between the pair of gates, the gate formed on one side of the trench and the word lines.

At this point, the finFET structure now includes a two-sided transistor. The left and right gates are also made very thin, making them high ohmic and ensuring that they only couple with their corresponding word line. This further ensures that the right and left gates will not short out.

By providing the holes in the trench of the finFET, the one-sided gate (formed on one side of the trench) can link the high ohmic gates to the low ohmic word line. The DRAM memory is now a two-sided finFET, but the word line-word line coupling is significantly reduced due to the thick metal layer deposited at the bottom of the trench. The one-sided gate that connects the high ohmic gates to the low-ohmic word line also means that each word line belongs to one fin only. The holes also allow the left-sided gate to be locally gated (coupled to the low-ohmic word line) which means that the connection can be direct, and does not have to start from one end of the word line. This allows for greater flexibility of design.

In the following, the method of forming the above finFET structure will be detailed. The gates on either side of the silicon pillar and the one-sided gate will be formed. A layer of oxide is formed around the one-sided gate. The holes can be formed either at this stage, or during the following metal deposition stage. The holes are ideally formed by a wet etching process.

Metal is deposited in the trench. This is typically tungsten, but can also be titanium nitride. The trench will be filled with tungsten until a thick word line is formed. At this point, the connection between the left and right gates and the word line needs to occur. This is done by at least partially filling the holes with metal, which enables the left and right gate connection.

Those skilled in the art will readily observe that numerous modifications and alterations of the device and method may be made while retaining the teachings of the invention.

What is claimed is:

1. A finFET structure, comprising:
   at least two fins having a trench between the fins;
   a pair of non-contiguous high ohmic gates comprising a right gate and a left gate respectively formed on a right side and a left side of each fin;
   a hole formed within each fin and between each pair of non-contiguous high ohmic gates for electrically connecting each pair of non-contiguous high ohmic gates;
   a one-sided gate formed on one side of the trench only and below one of the pair of non-contiguous high ohmic gates; and
   a low ohmic word line formed underneath the gate.

2. The finFET structure of claim 1, wherein the hole is at least partially filled with metal nitride.

3. The finFET structure of claim 1, wherein the low ohmic word line is formed by TiN or TiW.

4. The finFET structure of claim 1, wherein the one-sided gate is covered with oxide.

5. The finFET structure of claim 1, wherein the hole is formed during gate formation.

6. The finFET structure of claim 1, wherein the hole is formed during metal deposition process for forming the low ohmic word line.

* * * * *